(12) United States Patent
Boughton, Jr.

(10) Patent No.: US 7,525,376 B2
(45) Date of Patent: Apr. 28, 2009

(54) POWER AMPLIFIER WITH OUTPUT VOLTAGE COMPENSATION

(75) Inventor: Donald H. Boughton, Jr., Orlando, FL (US)

(73) Assignee: Asterion, Inc., Marlborough, MA (US)

(*) Notice: Subject to any disclaimer, the term of this patent is extended or adjusted under 35 U.S.C. 154(b) by 99 days.

(21) Appl. No.: 11/827,139

(22) Filed: Jul. 10, 2007

(65) Prior Publication Data
US 2008/0030277 A1   Feb. 7, 2008

Related U.S. Application Data

(60) Provisional application No. 60/819,803, filed on Jul. 10, 2006.

(51) Int. Cl.
*H03F 1/16* (2006.01)
*H04R 3/00* (2006.01)
(52) U.S. Cl. .................................. 330/102; 381/96
(58) Field of Classification Search .................. None
See application file for complete search history.

(56) References Cited

U.S. PATENT DOCUMENTS 4,969,195 A * 11/1990 Noro ........................ 381/96
5,031,500 A * 7/1991 Koike et al. ................ 84/600
5,068,903 A * 11/1991 Walker ...................... 381/96
6,396,933 B1 * 5/2002 Jung et al. .................. 381/96
6,600,368 B2   7/2003 Kim

FOREIGN PATENT DOCUMENTS

JP   1992-260206 A   9/1992
JP   2003-188653 A   7/2003

* cited by examiner

*Primary Examiner*—Robert Pascal
*Assistant Examiner*—Krista M Flanagan
(74) *Attorney, Agent, or Firm*—Lowrie, Lando & Anastasi, LLP

(57) ABSTRACT

A power amplifier to provide a compensated output voltage to a load through a series-connected impedance. The power amplifier includes an inner positive current feedback loop that is capable of sensing changes in the resistance of the load, and which adjusts the effective impedance of the series-connected impedance seen by the load to reduce current induced changes in the level of the compensated output voltage provided to the load due to the presence of the series connected impedance.

22 Claims, 5 Drawing Sheets

POWER AMPLIFIER WITH OUTPUT VOLTAGE COMPENSATION

CROSS REFERENCE TO RELATED APPLICATIONS

This application claims priority to U.S. Provisional Application Ser. No. 60/819,803, filed Jul. 10, 2006, entitled POWER AMPLIFIER WITH OUTPUT VOLTAGE COMPENSATION, which is incorporated by reference herein in its entirety.

BACKGROUND

1. Field of Invention

The present invention relates to power amplifiers with output voltage compensation, and more particularly to a power amplifier utilizing current feedback to provide output voltage compensation.

2. Discussion of Related Art

FIG. 4 is a functional block diagram of a conventional power amplifier 400 that receives an input voltage Vin and provides a voltage compensated output voltage Vout to a load 490. As depicted in FIG. 4, the power amplifier 400 includes an input (summing) stage 410, a voltage gain stage 420, a power gain stage 440, and a voltage feedback compensation stage 460 connected in the manner shown. The output voltage Vamp of the power amplifier 400 at output node 475 is sensed by the voltage feedback compensation stage 460, and a voltage feedback compensation signal that is based upon that sensed output voltage is provided to the input (summing) stage 410. Negative feedback is used to control the amount of amplification provided by the voltage gain stage 420 (and power gain stage 440) based upon a difference between the input voltage Vin and the voltage feedback compensation signal (which is itself based upon the output voltage Vamp of the power amplifier 400). Typically, there is some series output impedance 480 that is associated with circuitry to which the power amplifier 400 is connected, the load, or both.

Although the power amplifier 400 is capable of providing a compensated output voltage Vout, it may be relatively slow in responding to changes in the input resistance of the load 490. For example, it is known that the input resistance of certain loads, for example, integrated circuits, may change very rapidly. In response to such rapid changes in the input resistance of a load, the output voltage Vamp provided by the power amplifier 400 and the output voltage Vout provided to the load may fail to be adequately compensated.

FIG. 5 illustrates the voltage and current characteristics of a conventional power amplifier, such as that depicted in FIG. 4, in response to a change (specifically, an increase) in the input resistance of a load. Due to the sudden increase in resistance of the load (which may be due, for example, to the load entering a sleep mode, or other effective high impedance, low current state), the output current, Iout, provided to the load may drop to a negligible value in a very short period of time (e.g., as little as 5 ns). Because the output voltage Vamp is used for voltage feedback compensation, and the output voltage Vout=Vamp−Iout*(Zo(s)), the output voltage Vout provided to the load will see a rapid increase in value. Over time, the negative feedback provided by the voltage feedback compensation will eventually adjust the voltage output of the amplifier to the change in resistance of the load, but such adjustment may not be adequate to prevent damage to the load, etc.

SUMMARY OF INVENTION

Embodiments of the present invention are broadly directed to a power amplifier that may be connected to a load, the power amplifier having output voltage compensation that utilizes current feedback in an inner feedback loop of the power amplifier to compensate for rapid changes in a resistance of the load.

In accordance with one aspect of the present invention, a power amplifier is provided having an input to receive an input voltage and an output to provide a compensated output voltage to a load. The power amplifier comprises a voltage compensation stage, a first summing stage, a second summing stage, a voltage gain stage, a power gain stage, and an impedance compensation stage. The voltage compensation stage is coupled to the output of the power amplifier to provide a voltage compensation signal indicative of a voltage level of the compensated output voltage provided to the load. The first summing stage is coupled to the input of the power amplifier and the voltage compensation stage to receive the input voltage and the voltage compensation signal and provide a first output signal based upon a difference between the input voltage and the voltage compensation signal. The voltage gain stage is coupled to the first summing stage to receive the first output signal from the first summing stage and provide an adjusted output voltage that is based upon the first output signal. The impedance compensation stage is coupled to the output of the power amplifier to provide an impedance compensation signal based upon an amount of current provided to the load. The second summing stage is coupled to the voltage gain stage and the impedance compensation stage to receive the adjusted output voltage and the impedance compensation signal and provide a second output signal based upon a sum of the adjusted output voltage and the impedance compensation signal, and the power gain stage is coupled to the second summing stage and the output of the power amplifier to receive the second output signal and to adjust the voltage level of the compensated output voltage and the amount of current provided to the load.

In accordance with one embodiment, the power amplifier may further comprise a series-connected impedance, which may include a current measurement device, coupled between the output of the power amplifier and the load.

In accordance with another embodiment, the power amplifier further comprises a current sensing device, coupled between the power gain stage and the output of the power amplifier, and to the impedance compensation stage, to sense the amount of current provided to the load.

In accordance with yet another embodiment, the power gain stage may include a push-pull output stage that includes at least one high side (push) gain stage and at least one low side (pull) gain stage, wherein the impedance compensation stage includes a high side impedance compensation stage coupled to an output of the at least one high side (push) gain stage and a low side impedance compensation stage coupled to an output of the at least one low side (pull) gain stage. In accordance with this embodiment, the second summing stage may include a high side summing stage, coupled to the voltage gain stage, the high side impedance compensation stage, and the at least one high side (push) gain stage, and a low side summing stage, coupled to the voltage gain stage, the low side impedance compensation stage, and the at least one low side (pull) gain stage.

In accordance with another aspect of the present invention, a power amplifier is provided having an input to receive an input voltage and an output to provide a compensated output voltage to a load through a series-connected impedance. The power amplifier comprises a voltage compensation stage, coupled to the load, to provide a voltage compensation signal indicative of a voltage level of the compensated output voltage provided to the load; a first summing stage, coupled to the input of the power amplifier and the voltage compensation stage, to receive the input voltage and the voltage compensation signal and provide a first output signal based upon a difference between the input voltage and the voltage compensation signal; a voltage gain stage, coupled to the first summing stage, to receive the first output signal from the first summing stage and provide an adjusted output voltage that is based upon the first output signal; a power gain stage coupled between the voltage gain stage and the output of the power amplifier to receive an input signal that is based upon the adjusted output voltage and adjust the voltage level of the compensated output voltage and an amount of current provided to the load; and an inner feedback loop, coupled to the output of the power amplifier, the voltage gain stage, and the power gain stage, to sense a change in a resistance of the load, and adjust an effective impedance of the series-connected impedance due to the change in the resistance of the load.

In accordance with one embodiment, the inner feedback loop includes at least one current sensing device configured to sense the amount of current provided to the load, at least one impedance compensation stage coupled to the output of the power amplifier, to provide an impedance compensation signal based upon an amount of current provided to the load, and at least one second summing stage coupled to the voltage gain stage and the impedance compensation stage, to receive the adjusted output voltage and the impedance compensation signal and provide the input signal to the power gain stage that is based upon a sum of the adjusted output voltage and the impedance compensation signal. In a further embodiment, the power gain stage may include a push-pull output stage, wherein the push-pull output stage includes at least one high side (push) gain stage and at least one low side (pull) gain stage. In this embodiment, the at least one impedance compensation stage may include a high side impedance compensation stage coupled to an output of the at least one high side (push) gain stage, and a low side impedance compensation stage coupled to an output of the at least one low side (pull) gain stage. The at least one second summing stage may include a high side summing stage, coupled to the voltage gain stage, the high side impedance compensation stage, and the at least one high side (push) gain stage, and a low side summing stage, coupled to the voltage gain stage, the low side impedance compensation stage, and the at least one low side (pull) gain stage. In each of these embodiments, the series-connected impedance may include a current measurement device.

In accordance with another aspect of the present invention, a method of providing a compensated output voltage to a load through a series-connected impedance is provided. The method comprises acts of receiving an input voltage, determining a difference between the compensated output voltage being provided to the load and the input voltage, adjusting a voltage level of the compensated output voltage based upon the determined difference between the compensated output voltage being provided to the load and the input voltage, providing an amount of current to the load, sensing a change in a resistance of the load, and adjusting, responsive to the act of sensing the change in the resistance of the load, an effective impedance of the series-connected impedance to reduce effects of current induced changes in the compensated output voltage due to the change in the resistance of the load.

In accordance with one embodiment, the act of determining the difference between the compensated output voltage being provided to the load and the input voltage includes an act of subtracting the compensated output voltage from the input voltage to provide a first output voltage, and the act of adjusting the voltage level of the compensated output voltage includes an act of amplifying the first output voltage to provide an adjusted output voltage. In accordance with this embodiment, the act of adjusting the effective impedance includes acts of sensing the amount of current being provided to the load, and adjusting, responsive to the act of sensing, the amount of current being provided to the load.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
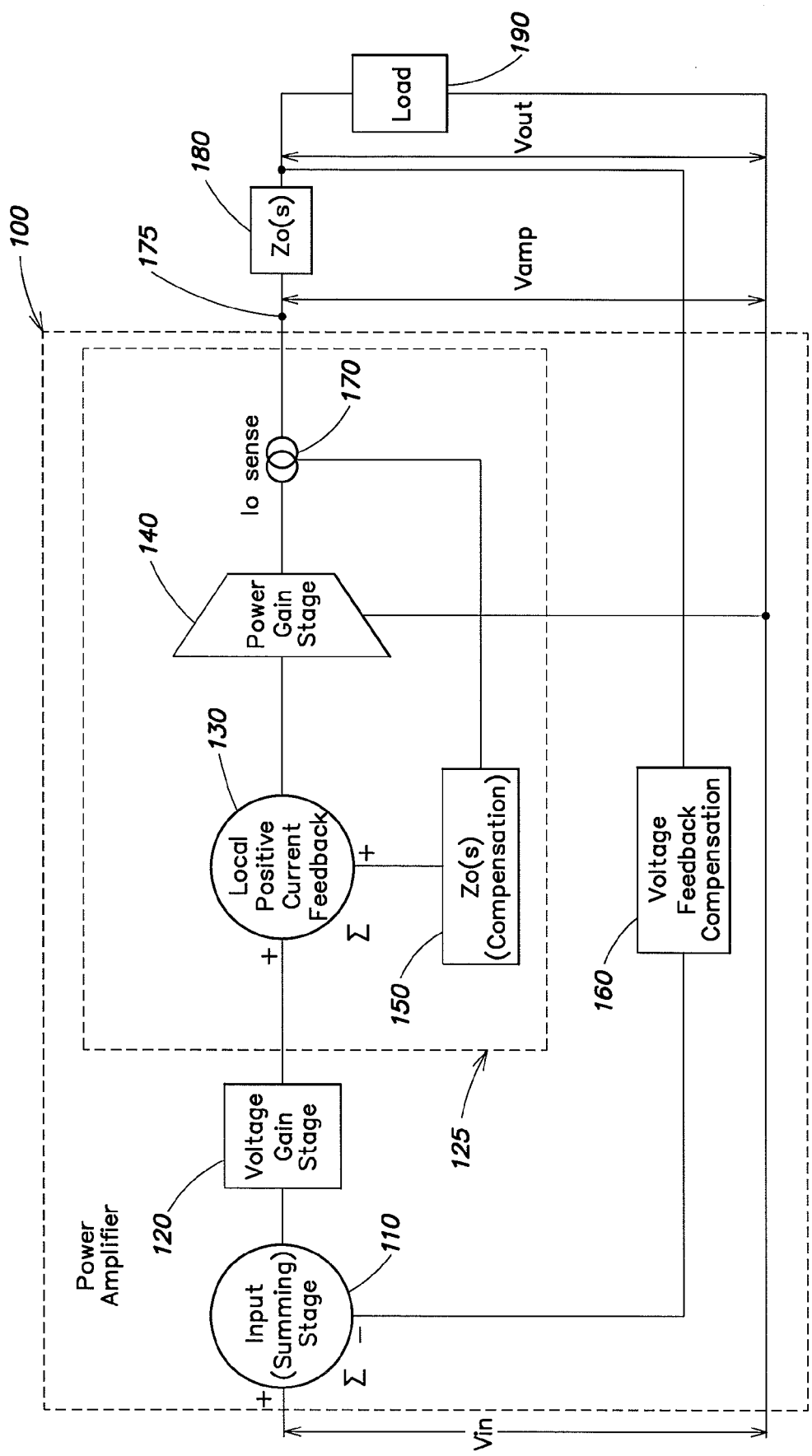
FIG. 1 illustrates a functional block diagram of a power amplifier that provides output voltage compensation and utilizes current feedback in an inner feedback loop of the power amplifier in accordance with an aspect of the present invention.

Various embodiments and aspects thereof will now be described in more detail with reference to the accompanying figures. It is to be appreciated that this invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

FIG. 1 is a functional block diagram of a power amplifier that provides output voltage compensation and utilizes current feedback in an inner feedback loop of the power amplifier in accordance with an aspect of the present invention.

In a manner similar to a conventional power amplifier, the power amplifier 100 includes an input (summing) stage 110, a voltage gain stage 120, a power gain stage 140, and a voltage feedback compensation stage 160. In a conventional manner, the input (summing) stage 110 receives an input voltage Vin and a voltage feedback compensation signal from voltage feedback compensation stage 160, and provides an output signal indicative of the difference between the input voltage Vin and the voltage feedback compensation signal to voltage gain stage 120.

Figure 4:
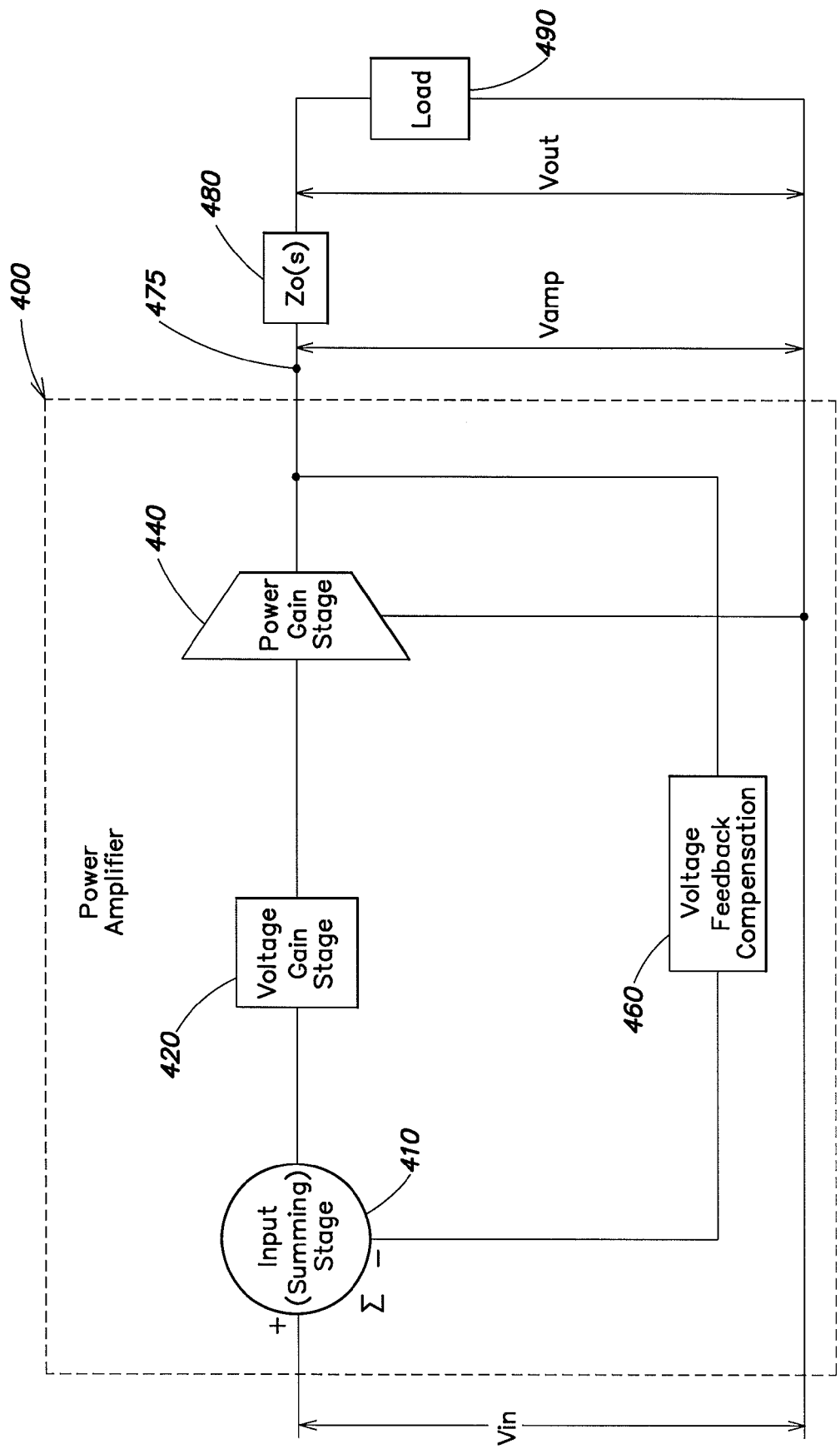
FIG. 4 is a functional block diagram of a conventional power amplifier that provides output voltage compensation.
Figure 5:
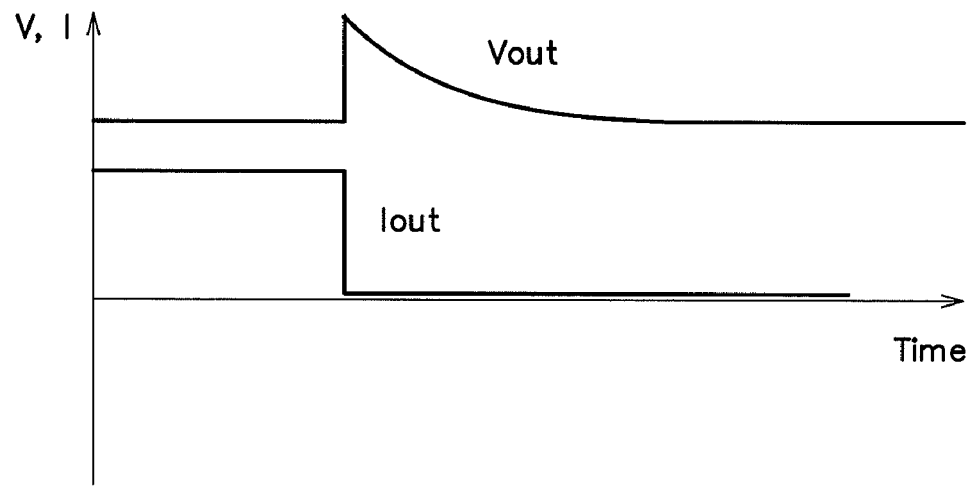
FIG. 5 illustrates voltage and current characteristics of a conventional power amplifier in response to changes in an input resistance of a load.

However, unlike the conventional power amplifier 400 depicted in FIG. 4, the voltage feedback compensation signal provided by the voltage feedback compensation stage 160 is based upon the output voltage Vout provided to the load, rather than the output voltage Vamp of the amplifier. In further contrast to the conventional power amplifier 400, the power amplifier 100 also includes a positive current feedback (summing) stage 130, a current sensing device 170, and an impedance compensation stage 150 that, together with the power gain stage 140, form an inner feedback loop 125 within the power amplifier 100. Although the use of positive current feedback is known, such feedback has conventionally been provided in the outer feedback loop (i.e., by sensing the amount of current provided at the output of the amplifier and providing a current feedback signal that is added as an input to the input (summing) stage 410 in FIG. 4). In accordance with the present invention, by positioning the positive current feedback within an inner feedback loop of the power amplifier, bandwidth limitations due to the voltage gain stage 120 may be avoided, thereby providing a voltage compensated power amplifier with a transient response time that is an order of magnitude faster than conventional designs.

As depicted in FIG. 1, the positive current feedback stage 130 is coupled between the output of the voltage gain stage 120 and the input to the power gain stage 140. The current sensing device 170, such as a resistor, a current sensing transformer, a Hall-effect device, etc., is coupled between the output of the power gain stage 140 and the output node 175 of the power amplifier 100. It should be appreciated that the current sensing device 170 may be disposed in other positions, provided it is capable of sensing the amount of current provided to the load. Coupled between the current sensing device 170 and the positive current feedback stage 130 is an impedance compensation stage 150 that is adapted to provide a compensation signal to compensate for current induced voltage drops (or gains) due to impedance 180 that is coupled between the output node 175 of the power amplifier 100 and the load 190. The positive current feedback stage 130 sums the output of the voltage gain stage 120 and the impedance compensation signal provided by the impedance compensation stage 150 to provide a compensated output signal to the power gain stage 140 that compensates for current induced changes in voltage of the voltage output signal Vout.

In accordance with one embodiment of the present invention in which the power amplifier 100 is used in an automated test system, the impedance 180 may, for example, be a measurement device, such as a current meter, that is connected between the output node 175 of the power amplifier and a device under test (e.g., the load 190). By sensing the current provided by the power gain stage 140 and knowing (or empirically measuring) the impedance of the measurement device, the impedance compensation stage 150 may provide an impedance compensation signal that compensates for any transient voltage spikes that are due to changes in current provided to the load 190 by cancelling effects on the output voltage Vout that are due to varying amounts of current dropped by the measurement device (or any other circuit components) disposed prior to the load 190. In this regard, differences in the amount of voltage dropped by the measurement device (or any other circuit components disposed prior to the load 190) may be sensed, and the output voltage Vamp of the amplifier 100 may be compensated therefor.

Figure 6:
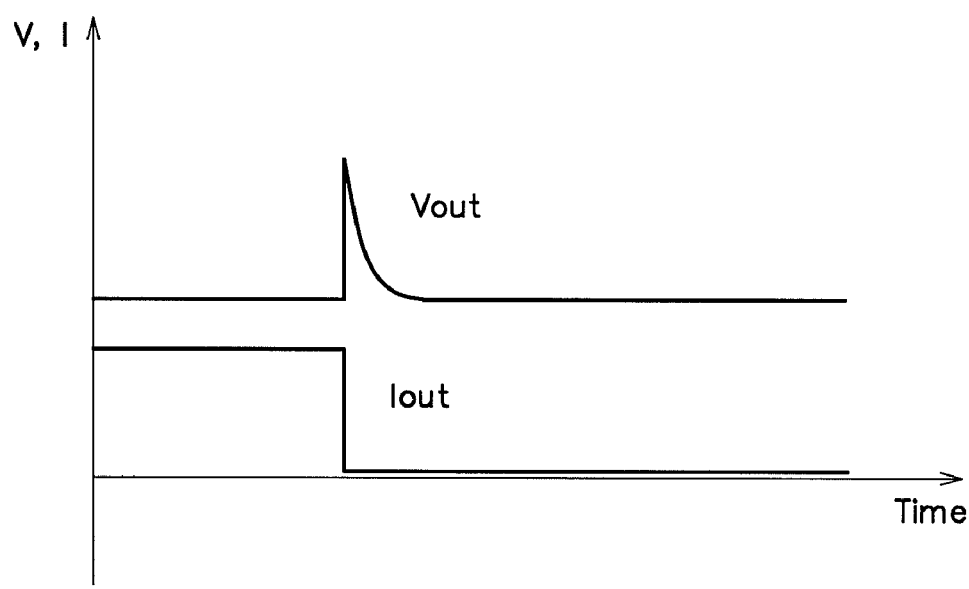
FIG. 6 illustrates voltage and current characteristics of a power amplifier in accordance with the present invention in response to changes in an input resistance of a load.

FIG. 6 illustrates the voltage and current characteristics of a power amplifier in accordance with an embodiment of the present invention in response to a change in resistance of a load. Due to a sudden change in the resistance of the load (specifically, an increase in resistance as shown in FIG. 6), the output current Iout provided to the load will suddenly decrease. This sudden decrease in output current Iout will result in less voltage being dropped by impedance 180, with the effect that the output voltage Vout provided to the load will quickly increase. Although this increase in output voltage Vout provided to the load will be sensed by the voltage feedback compensation stage 160, it will take some time (e.g., approximately 5 to 10 us) before the output voltage Vamp of the amplifier is adjusted to reflect that change. However, in accordance with embodiments of the present invention, this change in output current may be rapidly sensed by current sensing device 170, and the amount of gain provided by the power gain stage 140 adjusted to quickly compensate therefor. By utilizing current feedback within an inner feedback loop of the power amplifier and reducing the amount of current provided by the power gain stage 140, the output voltage Vout provided to the load may be adjusted in a period of time that is over an order of magnitude shorter than that which would occur with a conventional design, (e.g., approximately 40-150 ns instead of approximately 5-10 us).

Figure 2:
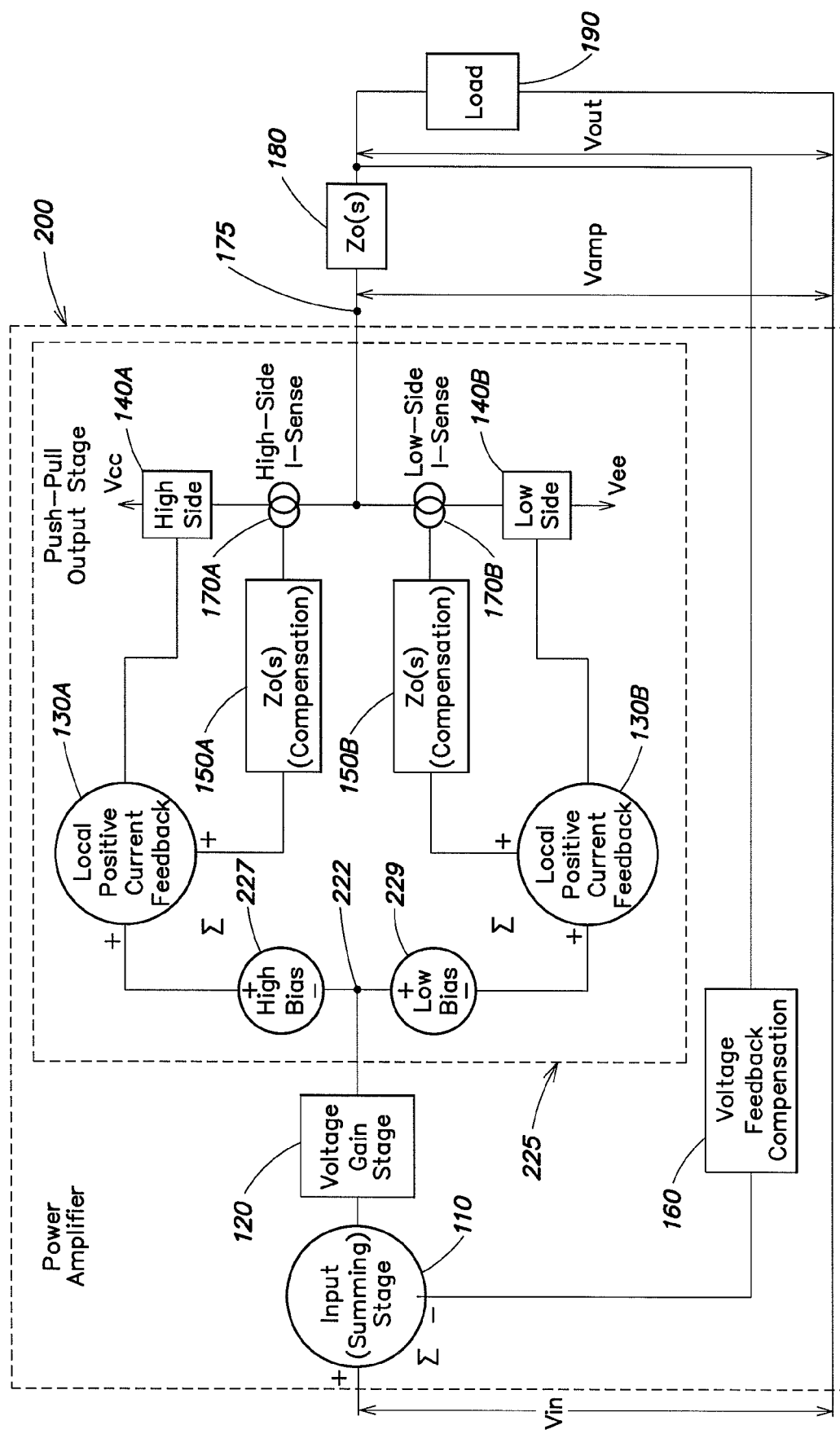
FIG. 2 is a detailed functional block diagram of a power amplifier that utilizes current feedback in an inner feedback loop of the power amplifier in accordance with one embodiment of the present invention.

FIG. 2 is a functional block diagram of one exemplary implementation of a power amplifier that utilizes current feedback in an inner feedback loop of the power amplifier in accordance with one embodiment of the present invention. As described previously with respect to the power amplifier 100 of FIG. 1, the power amplifier 200 of FIG. 2 includes an input (summing) stage 110, a voltage gain stage 120, and an inner feedback loop 225 that includes positive current feedback and a power gain stage. In the illustrative embodiment depicted in FIG. 2, the power gain stage is formed as a push-pull output stage and includes a high side (push) gain stage 140A and a low side (pull) gain stage 140B. In this illustrative embodiment, positive current feedback is provided for both the high side gain stage 140A and the low side gain stage 140B.

For the high side gain stage 140A, this positive current feedback includes a high side current sensing device 170A that is coupled to the output of the high side gain stage 140A, the output node 175, and a high side impedance compensation stage 150A. As described previously with respect to FIG. 1, the high side current sensing device 170A (and the low side current sensing device 170B described below) may be a resistor, a current sensing transformer, or any other device capable of sensing current. The output of the high side impedance compensation stage 150A is coupled to an input of a positive current feedback (summing) stage 130A which also receives a high bias output signal from voltage gain stage 120. The positive current feedback stage 130A receives the high bias output signal (depicted as a high bias voltage source 227 in FIG. 2) from the voltage gain stage 120 and an impedance compensation signal from the high side impedance compensation stage 150A, sums these signals, and provides an output to the high side gain stage 140A.

For the low side gain stage 140B, positive current feedback is also provided and includes a low side current sensing device 170B that is coupled to the output of the low side gain stage 140B, the output node 175, and a low side impedance compensation stage 150B. The output of the low side impedance compensation stage 150B is coupled to an input of a positive current feedback (summing) stage 130B, which also receives a low bias output signal from the voltage gain stage 120. The positive current feedback stage 130B receives the low bias output signal (depicted as a low bias voltage source 229 in FIG. 2) from the voltage gain stage 120, and an impedance compensation signal from the low side impedance compensation stage 150B, sums these signals, and provides an output to the low side gain stage 140B.

As in the embodiment of FIG. 1, the output node 175 of the power amplifier 200 may be coupled to an impedance 180, which may for example, be a measurement device that is connected between the output node 175 of the power amplifier 200 and a device under test (e.g., load 190).

Figure 3:
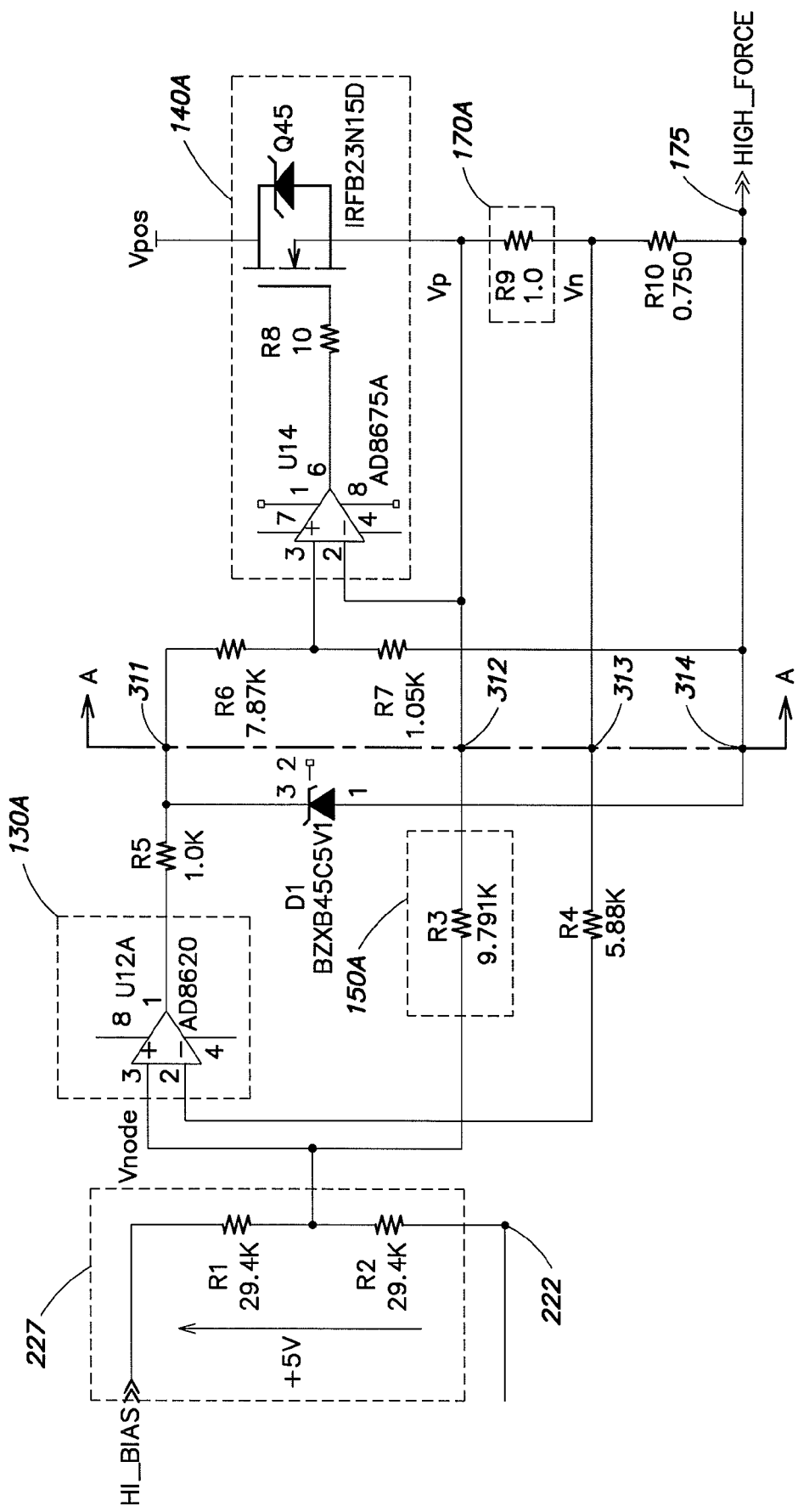
FIG. 3 is a circuit schematic diagram of a portion of the power amplifier depicted in FIG. 2.

FIG. 3 is a circuit schematic diagram of a portion of the power amplifier 200 described previously with respect to FIG. 2 that illustrates the manner in which the inner feedback loop 225 may be implemented. In the illustrated schematic diagram of FIG. 3, only that portion of the inner feedback loop 225 corresponding to the high side (e.g., high side positive current feedback stage 130A, high side gain stage 140A, high side current sensing device 170A, and high side impedance compensation stage 150A) is illustrated, with those circuit portions generally corresponding to those elements being depicted within dashed lines and identified by like reference numerals.

As shown, positive current feedback stage 130A, which may include an operational amplifier U12A (such as an AD8620 operation amplifier, available from Analog Devices, Inc.), receives the high bias output signal from voltage gain stage 120 through a voltage divider formed by the series connection of R1 and R2 (which acts as the high bias voltage source 227 depicted in FIG. 2) on its non-inverting input terminal. The non-inverting input terminal of the operational amplifier U12A also receives an impedance compensation signal from the high side impedance compensation stage 150A. In this manner, the node, Vnode, representing the junction of R1 and R2, impedance compensation stage 150A, and the non-inverting input of the operational amplifier U12A, acts to sum the signals provided by the high bias voltage source 227 and the high side impedance compensation stage 150A prior to providing that sum to the non-inverting input of operational amplifier U12A, thereby providing positive current feedback. In the illustrated embodiment of FIG. 3, the high side impedance compensation stage 150A is implemented by resistor R3. The output signal provided by the positive current feedback stage 130A is provided to the non-inverting input of another operational amplifier U14 (such as an AD8675A operational amplifier, also available from Analog Devices). The combination of amplifier U14 and power MOSFET Q45 (which may be a IRFB23N15D power MOSFET, available from International Rectifier Corporation) forms the high side output stage 140A of the power amplifier 200. The output of the power MOSFET Q45 is fed back to the inverting input of amplifier U14, to the high side impedance compensation stage 150A, and to the high side current sensing device 170A (which in this embodiment, is formed by a resistor R9) and through a resistor R10 that is connected to the output node 175 of the power amplifier 200. The output of the current sensing device 170A is also provided through a resistor R4 to the inverting input terminal of amplifier U12A. Resistor R4 is used to provide impedance balance for the two inputs of amplifier U12A by matching the equivalent combined resistance of R1, R2 and R3 seen by the non-inverting input of amplifier U12A to the resistance seen by the inverting input of amplifier U12A.

The inner feedback loop 225 corresponding to the low side (e.g., low side positive current feedback stage 130B, low side gain stage 140B, low side current sensing device 170B, and low side impedance compensation stage 150B) generally corresponds to the previously described high side, but with the Hi_Bias signal being replaced by a Low_Bias signal (formed by a voltage divider similar to the combination of R1 and R2 and acting as low bias voltage source 229 depicted in FIG. 2), and with a P-channel (rather than N-Channel) power transistor analogous to MOSFET Q45 being connected to Vee instead of Vcc (shown as Vpos in FIG. 3). Values for the various resistors illustrated in FIG. 3 may be as follows, although it should be appreciated that such values may change, depending on the impedance of 180.

| | | |
|---|---|---|
| R1 = 29.4 KΩ | R2 = 29.4 KΩ | R3 = 9.791 KΩ |
| R4 = 5.88 KΩ | R5 = 1.0 KΩ | R6 = 7.87 KΩ |
| R7 = 1.05 KΩ | R8 = 10 Ω | R9 = 1.0 Ω |
| R10 = 0.750 Ω | | |

In accordance with one illustrative embodiment in which the power amplifier 200 is used in an automated test system, the push-pull output stage may be replicated to provide an appropriate amount of power to the load. For example, as depicted in FIG. 3, in one embodiment, that portion of the circuit to the right of line A-A is replicated five more times, with both the high side and low side gain stages including a total of six gain stages each, connected in parallel. For both the high side and low side gain stages, the provision of a separate current sensing device 170A (i.e., R9 in the embodiment of FIG. 3) that is distinct from resistor R10 need only be present in one of the parallel-connected high side gain stages and one of the parallel-connected low side gain stages, with the output of the power MOSFET Q45 (or its equivalent low side power transistor) being connected directly through a resistor R10' (having an equivalent resistance equal to the sum of resistors R9 and R10) to output node 175 in the remaining stages. In this embodiment, the additional five high side gain stages may be connected in parallel at nodes 311, 312, and 314, with only one of the high side gain stages having a distinct positive current feedback connection via node 313. It should be appreciated that the number of parallel-connected high side and low side gain stages may vary, depending on the requirements of the load with which the power amplifier is used.

Having described the circuit topology of FIG. 3, a brief analysis of the circuit follows. In the following analysis, it is assumed that resistor R9 is used as the current sensing device 170A, Hi_Bias is 5 volts, and node 222 is at approximately ground potential. Using a Thevinin equivalent for Hi_Bias, R1 and R2, we have:

$Vth=2.5\ v$ and $Rth=(R1*R2)/(R1+R2)$.

Considering a first case where the output current Io=0 A, then since no voltage is dropped across R9, Vhigh_force=Vp=Vn=Vth, and thus, Vhigh_force_0=2.5 v.

Considering a second case where Io=1.6 A, then since six high side gain stages are connected in parallel, the current flowing through a single device is Io=1.6A/6. Therefore:

$Vn=Vhigh\_force\_1.6+Io*R10;$ (Equation 1)

$Vp=Vhigh\_force\_1.6+Io*(R9+R10)$ (Equation 2).

Based upon a node analysis, Vnode=Vn by virtue of the fact that the inputs to the amplifier U12 are effectively at equal voltage levels. Because the current into Vnode and out of Vnode must be equal, (Vp−Vnode)/R3+(Vth−Vnode)/Rth=0. Substituting Vn for Vnode, we have:

$(Vp-Vn)/R3+(Vth-Vn)/Rth=0.$ (Equation 3).

Substituting equations 1 and 2 into 3, we obtain:

$$[Vhigh\_force\_1.6+Io*(R9+R10)-(Vhigh\_force\_1.6+Io*R10)]/R3+[Vth-(Vhigh\_force\_1.6+Io*r10)]/Rth=0.$$

Upon rearrangement we obtain:

$$Vhigh\_force\_1.6+Io*R10=[(Io*R9)/R3]*Rth+Vth$$

or $$Vhigh\_force\_1.6=Vth+[(Io*R9)/R3]*Rth-Io*R10.$$

Substituting in the values given above for Vth, Io, R9, and R10, we obtain:

$$Vhigh\_force\_1.6=2.7\ v.$$

The change in voltage $\Delta V$ between the condition where the output current Io provided to the load is zero (0) versus the maximum 1.6/6 A is thus:

$$\Delta V = Vhigh\_force\_1.6 - Vhigh\_force\_0 = 0.2V.$$

The change in current $\Delta I$ between the condition where the output current Io provided to the load is zero (0) and a maximum (1.6/6 A) is thus:

$$\Delta I = 0 - Io = -1.6/6\ A = -0.267\ A$$

$Ro=\Delta V/\Delta I=-0.75\Omega$, and thus, embodiments of the present invention are capable of providing a negative output impedance to counter-act a change in resistance of the load. This negative impedance effectively reduces the effective impedance of any series connected impedance (e.g., series connected impedance 180) connected between the output node of the power amplifier and the load.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the scope of the invention. Accordingly, the foregoing description and drawings are by way of example only.

What is claimed is:

1. A power amplifier having an input to receive an input voltage and an output to provide a compensated output voltage to a load, the power amplifier comprising:
   a voltage compensation stage, coupled to the output of the power amplifier, to provide a voltage compensation signal indicative of a voltage level of the compensated output voltage provided to the load;
   a first summing stage, coupled to the input of the power amplifier and the voltage compensation stage, to receive the input voltage and the voltage compensation signal and provide a first output signal based upon a difference between the input voltage and the voltage compensation signal;
   a voltage gain stage, coupled to the first summing stage, to receive the first output signal from the first summing stage and provide an adjusted output voltage that is based upon the first output signal;
   an impedance compensation stage, coupled to the output of the power amplifier, to provide an impedance compensation signal based upon an amount of current provided to the load;
   a second summing stage, coupled to the voltage gain stage and the impedance compensation stage, to receive the adjusted output voltage and the impedance compensation signal and provide a second output signal based upon a sum of the adjusted output voltage and the impedance compensation signal; and
   a power gain stage coupled to the second summing stage and the output of the power amplifier, to receive the second output signal and to adjust the voltage level of the compensated output voltage and the amount of current provided to the load.

2. The power amplifier of claim 1, further comprising a series-connected impedance coupled between the output of the power amplifier and the load.

3. The power amplifier of claim 2, wherein the series-connected impedance includes a measurement device.

4. The power amplifier of claim 3, wherein the measurement device is a current measurement device.

5. The power amplifier of claim 4, further comprising a current sensing device to sense the amount of current provided to the load.

6. The power amplifier of claim 5, wherein the current sensing device is coupled between the power gain stage and the output of the power amplifier.

7. The power amplifier of claim 6, wherein the current sensing device is further coupled to the impedance compensation stage.

8. The power amplifier of claim 7, wherein the current sensing device is one of a resistor, a current sensing transformer, and a Hall-effect device.

9. The power amplifier of claim 8, wherein the power gain stage includes a push-pull output stage, and wherein the push-pull output stage includes at least one high side (push) gain stage and at least one low side (pull) gain stage.

10. The power amplifier of claim 1, wherein:
    the power gain stage includes a push-pull output stage that includes at least one high side (push) gain stage and at least one low side (pull) gain stage;
    wherein the impedance compensation stage includes a high side impedance compensation stage coupled to an output of the at least one high side (push) gain stage and a low side impedance compensation stage coupled to an output of the at least one low side (pull) gain stage.

11. The power amplifier of claim 10, wherein the second summing stage includes:
    a high side summing stage, coupled to the voltage gain stage, the high side impedance compensation stage, and the at least one high side (push) gain stage; and
    a low side summing stage, coupled to the voltage gain stage, the low side impedance compensation stage, and the at least one low side (pull) gain stage.

12. A power amplifier having an input to receive an input voltage and an output to provide a compensated output voltage to a load through a series-connected impedance, the power amplifier comprising:
    a voltage compensation stage, coupled to the load, to provide a voltage compensation signal indicative of a voltage level of the compensated output voltage provided to the load;
    a first summing stage, coupled to the input of the power amplifier and the voltage compensation stage, to receive the input voltage and the voltage compensation signal and provide a first output signal based upon a difference between the input voltage and the voltage compensation signal;
    a voltage gain stage, coupled to the first summing stage, to receive the first output signal from the first summing stage and provide an adjusted output voltage that is based upon the first output signal;
    a power gain stage coupled between the voltage gain stage and the output of the power amplifier to receive an input signal that is based upon the adjusted output voltage and adjust the voltage level of the compensated output voltage and an amount of current provided to the load; and an inner feedback loop, coupled to the output of the power amplifier, the voltage gain stage, and the power gain stage, to sense a change in a resistance of the load, and adjust an effective impedance of the series-connected impedance due to the change in the resistance of the load.

13. The power amplifier of claim 12, wherein the inner feedback loop includes:

at least one current sensing device configured to sense the amount of current provided to the load;

at least one impedance compensation stage coupled to the output of the power amplifier, to provide an impedance compensation signal based upon an amount of current provided to the load; and at least one second summing stage coupled to the voltage gain stage and the impedance compensation stage, to receive the adjusted output voltage and the impedance compensation signal and provide the input signal to the power gain stage that is based upon a sum of the adjusted output voltage and the impedance compensation signal.

14. The power amplifier of claim 13, wherein the series-connected impedance includes a current measurement device.

15. The power amplifier of claim 14, wherein the at least one current sensing device is coupled between the power gain stage and the output of the power amplifier.

16. The power amplifier of claim 15, wherein the power gain stage includes a push-pull output stage, and wherein the push-pull output stage includes at least one high side (push) gain stage and at least one low side (pull) gain stage.

17. The power amplifier of claim 16, wherein the at least one impedance compensation stage includes:

a high side impedance compensation stage coupled to an output of the at least one high side (push) gain stage; and a low side impedance compensation stage coupled to an output of the at least one low side (pull) gain stage.

18. The power amplifier of claim 17, wherein the at least one second summing stage includes:

a high side summing stage, coupled to the voltage gain stage, the high side impedance compensation stage, and the at least one high side (push) gain stage; and a low side summing stage, coupled to the voltage gain stage, the low side impedance compensation stage, and the at least one low side (pull) gain stage.

19. A method of providing a compensated output voltage to a load through a series-connected impedance, the method comprising acts of:

receiving an input voltage;

determining a difference between the compensated output voltage being provided to the load and the input voltage;

adjusting a voltage level of the compensated output voltage based upon the determined difference between the compensated output voltage being provided to the load and the input voltage;

providing an amount of current to the load;

sensing a change in a resistance of the load; and adjusting, responsive to the act of sensing the change in the resistance of the load, an effective impedance of the series-connected impedance to reduce effects of current induced changes in the compensated output voltage due to the change in the resistance of the load.

20. The method of claim 19, wherein the act of determining the difference between the compensated output voltage being provided to the load and the input voltage includes an act of subtracting the compensated output voltage from the input voltage to provide a first output voltage.

21. The method of claim 20, wherein the act of adjusting the voltage level of the compensated output voltage includes an act of amplifying the first output voltage to provide an adjusted output voltage.

22. The method of claim 21, wherein the act of adjusting the effective impedance includes acts of:

sensing the amount of current being provided to the load; and adjusting, responsive to the act of sensing, the amount of current being provided to the load.

\* \* \* \* \*